United States Patent [19]

DeVolk et al.

[11] Patent Number: 5,403,376
[45] Date of Patent: Apr. 4, 1995

[54] PARTICLE SIZE DISTRIBUTION FOR CONTROLLING FLOW OF METAL POWDERS MELTED TO FORM ELECTRICAL CONDUCTORS

[75] Inventors: Gerald A. DeVolk; Burt DeVolk, both of Albuquerque, N. Mex.

[73] Assignee: Printron, Inc., Albuquerque, N. Mex.

[21] Appl. No.: 268,878

[22] Filed: Jun. 30, 1994

Related U.S. Application Data

[63] Continuation of Ser. No. 853,240, Mar. 18, 1992, abandoned.

[51] Int. Cl.$^6$ ............................. C22C 1/08; C22C 9/00
[52] U.S. Cl. ..................................... 75/255; 420/469; 428/901
[58] Field of Search ....................... 75/255; 420/469; 428/901

[56] References Cited

U.S. PATENT DOCUMENTS

| | | | |
|---|---|---|---|
| 1,342,801 | 6/1920 | Gebauer | 419/47 |
| 2,358,326 | 9/1944 | Hensel et al. | 75/246 |
| 2,370,242 | 2/1945 | Hensel et al. | 75/245 |
| 3,049,435 | 8/1962 | Shwayder | 427/191 |
| 3,246,981 | 4/1966 | Quaas et al. | 427/191 |
| 3,407,057 | 10/1968 | Timmons | 75/255 |
| 3,502,493 | 3/1970 | Forestek | 428/206 |
| 3,508,320 | 4/1970 | Blue | 419/10 |
| 3,577,274 | 5/1971 | Taylor, Jr. et al. | 428/562 |
| 3,685,134 | 8/1972 | Blue | 419/23 |
| 3,743,533 | 7/1973 | Yurasko, Jr. | 427/456 |
| 3,790,406 | 2/1974 | Sakai et al. | 427/58 |
| 4,070,283 | 1/1978 | Kirkland | 210/656 |
| 4,190,441 | 2/1980 | Tengzelius et al. | 75/255 |
| 4,234,626 | 11/1980 | Peiffer | 427/97 |
| 4,235,631 | 11/1980 | Aciotta et al. | 75/255 |
| 4,569,692 | 2/1986 | Butt | 75/235 |
| 4,678,511 | 7/1987 | Yasuoka et al. | 75/255 |
| 4,944,797 | 7/1990 | Kemp et al. | 420/469 |
| 4,971,755 | 11/1990 | Kawano et al. | 75/255 |
| 5,211,741 | 5/1993 | Fife | 75/255 |

FOREIGN PATENT DOCUMENTS

| | | | |
|---|---|---|---|
| 625926 | 12/1962 | Belgium | 75/255 |
| 2749215 | 5/1978 | Germany | 75/255 |

*Primary Examiner*—George Wyszomierski
*Attorney, Agent, or Firm*—Lowe, Price, LeBlanc & Becker

[57] ABSTRACT

Electrical conductors on printed circuit board substrates are made from metal particles having a particular particle size range distribution used to control the flow of molten metal when entering the liquid phase such as during fusing. The distribution can follow a bimodal curve wherein the mixture contains approximately 45% by weight of large copper particles between 44-74 microns, 45% by weight of small copper particles less than 5 microns in size with the remaining 10% by weight being particles with sizes between the smaller and larger sizes.

11 Claims, 1 Drawing Sheet

PARTICLE SIZE DISTRIBUTION FOR CONTROLLING FLOW OF METAL POWDERS MELTED TO FORM ELECTRICAL CONDUCTORS

This application is a continuation of application Ser. No. 07/853,240, filed Mar. 18, 1992, now abandoned.

TECHNICAL FIELD

The present invention relates generally to curing metal powders, applied either directly in dry form or as an ink or paste to a substrate, to form continuous electrical conductors, and more particularly to a composition of differently sized metal particles to achieve continuous solid conductor lines upon partial melting and re-solidification into continuous metal conductors.

BACKGROUND ART

The use of metallic powders suspended in a viscous carrier or applied in dry form directly to a substrate using a conventional silk screen process or another type of application process is known. Thereafter, the particles are cured to form electrical conductors such as disclosed in U.S. Pat. Nos. 4,278,702 and 5,014,420.

Among the shortcomings of prior art of which we are aware, such as embodied in these prior art patents, is the fact that metallic particles of substantially uniform size are used and, as a result of experimentation, we have discovered that considerable shrinkage in the deposited traces is experienced when the particles are melted, which could lead to unwanted pattern distortion or breaking up of the conductive traces into discontinuous balls. As best understood, it is theorized that distortion occurs since the use of powders of substantially uniform size results in voids between the individual particles such that, upon melting, the melted particles flow to fill these voids, causing shrinkage and separation of the particles forming the conductor line into the discrete balls which are spaced from each other to form discontinuous conductor portions.

It is accordingly one object of the present invention to provide a composition of metal powders which may be applied in dry form, or as an ink or paste containing binders, to a substrate, and which has minimal shrinkage and distortion upon being cured, by melting, into solid electrical conductors.

Another object is to provide a new and improved metal particle composition for additive printing of printed circuit boards.

Still another object is to control the metallurgical flow of a printed mass of metal powder when heated to a partial melt by using a specific particle size distribution.

Yet another object is to provide a metal particle composition particularly suited to curing by rapid electromagnetic heating.

Yet another object is to provide a composition wherein the particle sizes are selected to minimize shrinkage while maintaining good edge resolution of the printed pattern conductor lines.

SUMMARY OF THE INVENTION

A metal powder mixture for application, in a dry form or as a viscous ink or paste, to a substrate to form electrical conductor traces when fused by melting, consists essentially of a metal powder having a particular size distribution based upon a mixture of different ranges of large and small particle sizes.

The ranges of particle size are preferably selected so that the total volume of metal in the fused state is between about 65–98% of the total volume taken up by the metal particles and voids between the particles in an unfused state to thereby reduce shrinkage.

When the different particle sizes are blended together into the desired particle size distribution, heating of the particles, after being applied as traces to the substrate and such as by electromagnetic heating, occurs to the point that some of the particles melt and flow and wet the other particles which other particles tend to remain solid to give the melt a viscous effect to achieve controlled flow. The melt from the other, larger particles fills the interstitial voids and gaps between the larger particles and the smaller particles which tend not to melt so that, upon solidification, the resulting conductor appears solid when viewed as a microstructure.

Still other objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRYING OUT THE INVENTION

Figure 1A:
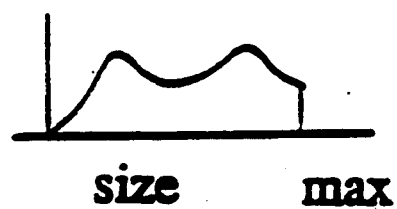
FIGS. 1A and 1B are illustrations of bimodal gaussian/exponential curves describing distributions of metal powder mixtures or compositions in accordance with the present invention.

The purpose of the present invention is to provide a particle size distribution of metal powders to control the flow of molten metal upon being heated after application as traces to a substrate. These traces may either be applied to the substrate as a metallic powder or viscous ink or paste containing the metallic particles in a binder. The traces may be applied to the substrate such as by conventional silk screening and other conventional application methods, or one of the methods disclosed in co-pending application Ser. No. 07/853,552, filed Mar. 18, 1992 entitled "Apparatus and Method for Depositing Metal Particles on a Dielectric Substrate", or application Ser. No. 07/853,192, entitled "Method and Apparatus for Applying Particles to a Substrate in a Predetermined Pattern", filed Mar. 18, 1992, and now abandoned both assigned to PrinTron, Inc., both applications of which are incorporated by reference herein.

More specifically, it has been discovered that if the particle size distribution is not sufficiently wide, groups of particles will "ball up" into small spheres as the particles reach their melting temperature because the surface tension of the liquid metal overcomes other forces. Further, when heating by electromagnetic means, greater flux density or higher frequencies are needed to melt small particles, so that the particle size distribution selected determines the minimum frequency and power at which the particles will melt.

By having a sufficiently wide particle size distribution, as discussed below and in accordance with this invention, it is theorized that after the larger particles begin to melt, such as when exposed to electromagnetic radiation in the manner disclosed in co-pending application Ser. No. 07/853,237, filed concurrently herewith and entitled "Method and Apparatus for Curing Metal Particles into Continuous Conductors", assigned to Printron, Inc. and incorporated by reference herein, or by other heating methods, the molten liquid from the larger particles flows over adjacent smaller particles, wetting them. It is also theorized that this composition is more viscous than a totally liquified mass resulting from a complete melt of all particles, thereby allowing it to remain in the predetermined pattern deposited on the substrate with minimal shrinkage and no balling up.

In one example of this invention, the composition must contain a substantial percentage of large particles (e.g., between 44–74 microns) and a substantial percentage of small particles (e.g., 5 microns or less), thereby resulting in a bimodal particle size distribution. For example, the larger particles may comprise 45% by weight and the smaller particles 45% by weight of the metal particles, with the remaining 10% by weight comprising particles with sizes in between the larger and smaller particles. If the particle size distribution is not sufficiently wide, the groups of particles will "ball up" into small spheres as the particles reach their melting temperature because the surface tension of the liquid metal overcomes other forces, as aforesaid.

Other particle size range distributions are possible. For example, the distribution may have the following particle sizes in the indicated ranges of percentages by volume and screen size ranges: approximately 35–45% by volume of particles having a screen mesh size range of 230–270 mesh; approximately 35–45% by volume of particles having a size of 270–325 mesh; and approximately 10–30% by volume of particles having a size of about 325–400 mesh.

When using electromagnetic heating, the amount of energy absorbed by the particle is dependent upon the ratio of particle dimensions to the period of oscillation of the EM fields. Also, there is a maximum size of particle which can be used and still maintain good edge resolution of the printed pattern. For a conductor line width of 300 microns, the maximum size particle is conventionally 30 microns or one tenth the line width. So, for a given frequency of electromagnetic field and a given maximum particle size, the distribution of particle sizes affects the ability of the metal particles to absorb energy. It also affects the shielding effect of neighboring particles on each other by field attenuation. In practice, particles which are larger heat up faster, especially on the surface where the current density is higher. These particles begin to melt away on their surface first. This flow of metal mass in liquid form wets the finer particles as it flows throughout the printed volume which may be analogized to a solute rich melt. In effect, therefore, the finer particles act as a mortar in holding together the printed mass and prevents excess flow and distortion.

Distortion is minimized by having a wide enough range of particle sizes so that the total volume of metal approaches 65–98% of the total volume taken up by the metal and voids between particles in a dry state. This advantageously reduces shrinkage.

Figure 1B:
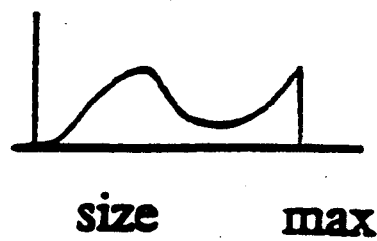

It is believed that suitable distributions are, by volume:

a. bimodal gaussian/truncated gaussian;
b. bimodal gaussian/exponential, as depicted in FIGS. 1A and 1B.
c. bimodal with a peak or plateau in the large particle size range (which is dependent upon the frequency of the applied EM field) and another peak or plateau in the 1–5 micron range.

As will now occur to one of ordinary skill in the art, the maximum particle size will be dependent on the desired line width as aforesaid.

The fine to coarse particles may be blended together in conventional ways known in the art, such as with a roller mill.

By providing metal powder mixtures or compositions having the aforementioned types of particle size distributions, continuous electrical conductors are formed such as by electromagnetic induction to the point where only some of the particles melt and flow and wet the other particles which remain solid and thereby give the molten mass a "viscous effect" which prevents balling up and which also minimizes distortion of the conductor line. The resulting microstructure of the printed and cured powder or ink will be such that the gaps and voids between the solid particles which have not melted will be filled in by the melt from the surface of the larger particles. There are substantially no voids or air gaps within the solid body of the conductor but there are also within the structure solid chunks of smaller particles which does not melt but without surrounding voids.

In one preferred embodiment of this invention, pure copper particles (or other pure single element metal particles) of different size ranges are mixed together to obtain the desired particle size distribution. However, it is also within the scope of this invention to mix particles of different types of "pure metals" with each other to obtain compositions having the aforementioned types of particle size distributions. "Pure metals", as used in this application, is either a single element metal, or an alloy of two or more metals. It is further within the scope of this invention to use metal particles which are coated with a second metal (e.g., of lower melting temperature) or coated with a dielectric material so that the particles can hold a charge and be electrostatically printed. An example of this is a paste, a starting material of which is a paste material, (Product No. CL 81-5257 manufactured by Heraeus Incorporated). The paste comprises smaller copper particles, most of which range in size between 1–5 microns, and a binder and other agents which promote adhesion comprising approximately 5% by weight of the starting paste. To this paste was added a powdered Cu—Ag alloy comprising 50% copper and 50% silver, by volume, with these larger particles ranging in size between 44–74 microns. The larger particles comprise approximately 45% by weight of the resulting paste and the smaller particles comprise approximately 45% by weight of the resulting paste. The remaining 5% by weight are particles between the ranges of 1–5 microns and 44–74 microns.

As mentioned above, the metal powder may be heated to a partial melt by various heating techniques, including electromagnetic induction in the manner disclosed in the above-identified co-pending application. Therein, there is disclosed a generator for supplying radio frequency energy through an impedance matching circuit to a coil positioned proximate to the substrate on which the metal particles are disposed. The coil and substrate are placed in a chamber which is evacuated prior to curing and then pressurized with nitrogen gas. The electromagnetic flux lines generate eddy currents in the particles which heat them until the sum melt to convert the metal particles into continuous conductors. The curing system may comprise a conventional radio frequency generator generating a high energy radio frequency signal which is transmitted over a standard 50 ohm cable. The generator may output a 13.56 MHz signal at a power of between 0.5–3.0 kw. It should be understood, however, that the frequency in power applied by the generator may vary according to the desired curing speed and the particle size distribution. This signal is fed to a conventional impedance matching network which matches the impedance of the curing coil to the 50 ohm load on the cable. The foil typically has a resistance of between 0.05 to 0.1 ohms.

Due to impedance matching substantially all of the power generated the RF generator is absorbed in the coil resistance so that large currents flow through the coil and it generates a correspondingly large amount and intensity of electromagnetic flux lines which are relatively uniform over the cross-sectional area of the coil. The coil is positioned in a curing chamber and the substrate containing the pattern of metallic particles to be cured into printed circuit conductors is placed adjacent the coil. The curing chamber is evacuated by a pump and nitrogen or an inert gas is pumped in. The coil is then energized to generate electromagnetic flux that passes through the metal particles causing the eddy currents to be generated in these particles. Preferably, this flux is of relatively uniform density across the conductor traces and the eddy currents heat the particles rapidly until at least some of them melt in the manner described above.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

We claim:

1. A metal powder mixture for application, in a dry form or as a viscous ink or paste, to a substrate to form electrical conductor traces when fused by at least partial melting, comprising a metal powder having a particle size distribution which has the following particle sizes in the indicated ranges of percentages by volume and screen size ranges: approximately 35–45% by volume of larger size particles having a screen mesh size range of 230–270 mesh; approximately 35–45% by volume of other particles having a size of 270–325 mesh; and approximately 10–30% by volume of other particles having a size of about 325–400 mesh, said particle size distribution being such that at least a portion of said larger size particles will melt upon application of sufficant heat and said portion will flow and wet the other particles which remain solid so that voids surrounding said other particles which have not melted will be substantially filled in by the melted portion of said larger size particles.

2. The metal powder mixture of claim 1, wherein the ranges of particle size are such that the total volume of metal in the fused state is between about 65–98% of the total volume taken up by the metal particles and voids between said particles in an unfused state.

3. The metal powder mixture of claim 2, wherein said total volume in the fused state is 98% of the total volume in the unfused state of a dry mixture.

4. The metal powder mixture of claim 1, wherein said mixture has about 40% by volume of particles in the range of 230–270 mesh, approximately 40% by volume of particles in the size range of 270–325 mesh, and about 20% by volume of particles in the size range of 325–400 mesh.

5. The metal powder mixture of claim 1, wherein said metal powder includes copper particles.

6. The metal powder mixture of claim 1, wherein the range of particle sizes is selected as a function of a bimodal curve with a peak or a plateau in the larger particle size range and another peak or plateau in one of other particle size ranges.

7. The metal powder mixture of claim 6, wherein said curve is a bimodal gaussian/truncated gaussian.

8. The metal powder mixture of claim 6, wherein said curve is a bimodal gaussian/exponential curve.

9. A metal powder mixture comprising approximately 45% by weight of large copper particles between 44–74 microns, approximately 45% by weight of small copper particles between 1–5 microns with substantially entirely the remaining 10% by weight being particles with sizes between the larger and smaller sizes.

10. A metal powder composition substantially free of voids or air gaps, said composition having been made by subjecting a metal powder, having a particle size distribution which has the following particle sizes in the indicated ranges of percentages by volume and screen size ranges: approximately 35–45% by volume of larger size particles having a screen mesh size range of 230–270 mesh; approximately 35–45% by volume of other particles having a size of 270–325 mesh; and approximately 10–30% by volume of other particles having a size of about 325–400 mesh, to a sufficient amount of heat so as to melt at least a portion of the larger size particles so that the melted portions flow and wet the other particles which remain solid so that said voids surrounding said other particles which have not melted are substantially filled in by the melted portion of said larger size particles in response to application of said sufficient heat.

11. The metal powder composition of claim 10, disposed on a printed circuit board substrate in the form of an electrical conductor.

* * * * *